United States Patent [19]

Raghunathan

[11] Patent Number: 4,521,696
[45] Date of Patent: Jun. 4, 1985

[54] VOLTAGE DETECTING CIRCUIT
[75] Inventor: Kuppuswamy Raghunathan, Austin, Tex.
[73] Assignee: Motorola, Inc., Schaumburg, Ill.
[21] Appl. No.: 395,424
[22] Filed: Jul. 6, 1982
[51] Int. Cl.³ .......................... H03K 5/153; H03K 5/24
[52] U.S. Cl. .................................... 307/350; 307/360; 307/362
[58] Field of Search ................ 307/350, 362, 296 R, 307/360, 264

[56] References Cited
U.S. PATENT DOCUMENTS 3,936,676  2/1976  Fujita ................................. 307/474
4,045,688  8/1977  Stewart ............................ 307/585
4,348,596  9/1982  Atherton et al. ................. 307/264

Primary Examiner—John Zazworsky
Attorney, Agent, or Firm—Anthony J. Sarli, Jr.; Jeffrey Van Myers

[57] ABSTRACT

A voltage detecting circuit is disclosed having a first field effect transistor of a first type coupled in series with a second field effect transistor of a second type between a first supply voltage node and an input node, with the current channel regions coupled to the same node as the sources thereof, and the gates thereof coupled to a second supply voltage node. If the on resistance of the second transistor is significantly greater than that of the first transistor, the output node, formed by the common drains of the transistors, will be substantially the first supply voltage when the input signal is absent, and the voltage of the input signal signal when the latter is present.

3 Claims, 1 Drawing Figure

U.S. Patent Jun. 4, 1985 4,521,696
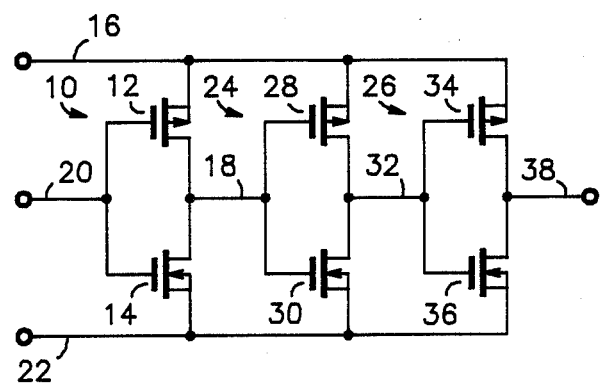

ion bill, which is substantially less
VOLTAGE DETECTING CIRCUIT

CROSS REFERENCE TO RELATED APPLICATIONS

Related subject matter can be found in copending U.S. patent application Ser. No. 395,958 entitled "A VOLTAGE TRANSLATING CIRCUIT", filed simultaneously herewith and assigned to the assignee of the present invention.

BACKGROUND OF THE INVENTION

1. Field of the Invention

This invention relates generally to voltage detecting circuits, and more particularly, to a voltage detecting circuit for detecting the presence of an input voltage which is outside the range of the supply voltages of the circuit.

2. Description of the Prior Art

In general, voltage detecting circuits are designed to provide a particular output in response to the presence of an input signal which is within the range of the supply voltages of the circuit. However, in some applications, it is desirable to detect the presence of input voltages which are outside the range of the supply voltages of the detecting circuit. For example, in a typical monolithic microprocessor having a electrically programmable read only memory (EPROM), the supply voltages of the microprocessor will be +5 volts and 0 volts. However, the on-chip EPROM can only be programmed using a programming voltage well outside of these supply voltages. In a typical N-channel device, the programming voltage will be of the order of +20 volts, while in a CMOS device the programming voltage would be of the order of −15 or +20 volts depending upon the conductivity type of the field effect transistors used to form the EPROM storage cells. If the microprocessor is also of the self-programming type, i.e. capable of automatically transfering the contents of an external memory into the on-chip EPROM, some means must be provided to force the device into the self-programming mode. One convenient way for performing this function is to provide a voltage detecting circuit which provides a distinctive output signal only when the programming voltage is applied to a particular input pin of the microprocessor. However, prior art voltage detecting circuits of this type have tended to be of the rather complicated voltage comparator form. In addition, the output signal which such prior art voltage detection circuits provide to indicate the presence of the programming voltage has typically been restricted to the range of the supply voltages.

SUMMARY OF THE INVENTION

An object of the present invention is to provide a simple voltage detecting circuit for detecting the presence of an input signal outside the range of the supply voltages of the circuit.

Another object of the invention is to provide a voltage detecting circuit for providing an output signal which is substantially the same voltage as a detected input signal outside the range of the supply voltages of the circuit.

These and other objects are acheived in a voltage detecting circuit comprising a first field effect transistor having a source region of a first conductivity type coupled to a first supply voltage node, a drain region of the first conductivity type coupled to an output node, a current channel region of a second conductivity type between the source and drain regions thereof and coupled to the first supply voltage node, and a gate electrode adjacent to but insulated from the current channel region thereof and coupled to a second supply voltage node; and a second field effect transistor having a source region of the second conductivity type coupled to an input node, a drain region of the second conductivity type coupled to the output node, a current channel region of the first conductivity type between the source and drain regions thereof and coupled to the input node, and a gate electrode adjacent to but insulated from the current channel region thereof and coupled to the second supply voltage node. Preferably, the on resistance of the second transistor is substantially less than the on resistance of the first transistor.

BRIEF DESCRIPTION OF THE DRAWING

The single FIGURE is a schematic diagram of a voltage detecting circuit constructed in accordance with the present invention.

DESCRIPTION OF THE PREFERRED EMBODIMENT

Shown in the FIGURE is a voltage detecting circuit 10 comprised primarily of a P-channel field effect transistor 12 and an N-channel field effect transistor 14. The transistor 12 has a P-type source region coupled to a positive supply voltage node 16, a P-type drain region coupled to a node 18, an N-type current channel region between the source and drain regions thereof and coupled to the positive supply voltage node 16, and a gate electrode adjacent to but insulated from the current channel region thereof and coupled to a negative supply voltage node 20. The transistor 14 has an N-type source region coupled to an input node 22, an N-type drain region coupled to the node 18, a P-type current channel region between the source and drain regions thereof and coupled to the input node 22, and a gate electrode adjacent to but insulated from the current channel region thereof and coupled to the negative supply voltage node 20.

In operation, the positive and negative supply voltage nodes 16 and 20, respectively, will be coupled to a power supply (not shown) capable of developing a potential differential of the order of +3 to +15 volts therebetween. Accordingly, the transistor 12 will be biased in the on or conducting condition, thereby tending to charge the node 18 toward the positive supply voltage. As long as the voltage on the input node 22 is within the range of the supply voltages, the transistor 14 will be biased in the off or non-conducting condition, thereby allowing the transistor 12 to charge node 18 to the positive supply voltage. However, if the input node 22 is coupled to an input signal which is below the negative supply voltage by at least the threshold voltage of the transistor 14, the transistor 14 will be biased in the on or conducting condition, thereby tending to discharge the node 18 toward the voltage of the input signal. Under these conditions, the voltage on the node 18 will settle between the positive supply voltage and the voltage of the input signal, depending upon the relative saturation currents of the transistors 12 and 14.

For example, assuming a current channel width to length ratio of 6/25 for the transistor 12 and 50/7 for the transistor 14, the on resistance of transistor 14 will be substantially smaller than the on resistance of transistor 12, so that the voltage drop across transistor 12 will be much greater than the drop across transistor 14 when the voltage of the input signal is sufficiently below the negative supply voltage to enable transistor 14 to conduct more current than transistor 12. Thus, the voltage on node 18 will be substantially equal to the voltage of the input signal.

In some applications, the grossly imbalanced source and sink currents on the node 18 in the above example may be undesirable. In the illustrated form, transistors 12 and 14 may be significantly smaller than in the example above, since the resulting increase in voltage on the node 18 is compensated for by including additional gain stages 24 and 26. For example, using a "design" input signal of −15 volts, the width to length ratios of transistors 12 and 14 may be 25/10 and 8/15, respectively, so that the resulting on resistance of transistor 14 will be still be smaller than the one resistance of transistor 12. However, the voltage on the node 18 will be in range of about −8 volts when the input signal is −15 volts. This voltage swing is increased by gain stage 24, which comprises a second P-channel field effect transistor 28 and a second N-channel field effect transistor 30 connected the same as the transistors 12 and 14, respectively, but with the gate electrodes thereof coupled to the node 18. If, for example, the width to length ratios of transistors 28 and 30 are selected to be 30/6 and 6/6, respectively, then the switch point of the gain stage 24 will be about 0 volts, and the voltage developed on node 32 will swing between the positive supply voltage and the voltage of the "design" input signal, i.e. −15 volts for the given example. It will be noted however, that the on resistance of the transistor 28 is still somewhat smaller than the on resistance of transistor 30. Balanced currents are obtained while preserving the full voltage swing by gain stage 26, which comprises a third P-channel field effect transistor 34 and a third N-channel field effect transistor 36 connected the same as transistors 12 and 14, respectively, but with the gate electrodes coupled to the node 32. Using a conventional width to length ratios for transistors 34 and 36 of 30/6 and 10/6, respectively, then the switch point of the gain stage 26 will be half way between the positive supply voltage and the voltage of the "design" input signal, and the voltage developed on node 38 will swing between the positive supply voltage, i.e. +5 volts, and the voltage of the "design" input signal of −15 volts. In addition, the source and sink currents on node 38 will be the same.

One use for the voltage detecting circuit 10 described above is in an electrically programmable read only memory (EPROM) integrated circuit to detect the coupling of a characteristic programming voltage outside the range of the normal supply voltages to a particular input pin, and thus enable the programming logic thereof. An example of a voltage translating circuit suitable for cooperating with the voltage detecting circuit 10 to perform the word line select function is described in the copending Application Ser. No. 395,958 (SC04397A) cited above.

From the examples given above, it can be seen that the voltage detecting circuit 10 provides as the output thereof the positive supply voltage in the absence of an input signal having a voltage below the negative supply voltage, and the input signal itself when the latter is present. However, due to the complementary nature thereof, the voltage detecting circuit 10 can be easily used to detect an input signal above the positive supply voltage by coupling the negative supply voltage to node 22, the positive supply voltage to node 20, and the input signal to node 16. Assuming the same transistor sizes as in the last example and a "design" input signal of +20 volts, the output on node 38 will be the negative supply voltage in the absence of the input signal, and the input signal of +20 volts when the latter is present. Of course, either form of the voltage detecting circuit 10 may be made to respond to different "design" input signals outside the range of the selected positive and negative supply voltages by applying conventional algorithms to select the sizes of transistors 12 and 14, and, if present, transistors 28–30 and 34–36. Other changes and modifications may be made to the preferred embodiment described herein without departing from the spirit and scope of the present invention as defined in the following claims.

I claim:

1. In a integrated circuit adapted to receive operating power via first and second supply voltage nodes, a voltage detecting circuit for providing an output signal when an input signal applied to an input node of the integrated circuit exceeds the voltage on the second supply voltage node, comprising:

a first field effect transistor having a source region of a first conductivity type coupled to the first supply voltage node, a drain region of the first conductivity type coupled to an output node, a current channel region of a second conductivity type between the source and drain regions and coupled to the first supply voltage node, and a gate electrode adjacent to but insulated from the current channel region and coupled to the second voltage node; and a second field effect transistor having a source region of the second conductivity type coupled to the input node, a drain region of the second conductivity type coupled to the output node, a current channel region of the first conductivity type between the source and source and drain regions and coupled to the input node, and a gate electrode adjacent to but insulated from the current channel region and coupled to the second supply voltage node, the on resistance of the second transistor being smaller than the on resistance of the first transistor to provide a voltage swing on the output node substantially between the voltage on the first supply voltage node and a voltage between the voltage on the second supply voltage node and the voltage on the input node.

2. The voltage detecting circuit of claim 1 further including at least one additional gain stage coupled to the output node to provide an output signal having more balanced source and sink currents while still providing an output voltage swing between the voltage on the first supply voltage node and the input node.

3. In a integrated circuit adapted to receive operating power via first and second supply voltage nodes, a voltage detecting circuit for providing an output signal when an input signal applied to an input node of the integrated circuit exceeds the voltage on the second supply voltage node, comprising:

a first field effect transistor having a source region of a first conductivity type coupled to the first supply voltage node, a drain region of the first conductivity type coupled to an output node, a current channel region of a second conductivity type between the source and drain regions and coupled to the first supply voltage node, and a gate electrode adjacent to but insulated from the current channel region and coupled to the second voltage node; and
a second field effect transistor having a source region of the second conductivity type coupled to the input node, a drain region of the second conductivity type coupled to the output node, a current channel region of the first conductivity type between the source and source and drain regions and coupled to the input node, and a gate electrode adjacent to but insulated from the current channel region and coupled to the second supply voltage node, the on resistance of the second transistor being substantially smaller than the on resistance of the first transistor to provide a voltage swing on the output node substantially between the voltage on the first supply voltage node and the voltage on the input node.

* * * * *